(12) United States Patent  (10) Patent No.: US 11,579,525 B2
Li et al.  (45) Date of Patent: Feb. 14, 2023

(54) PHOTORESIST COMPOSITION, PIXEL DEFINITION STRUCTURE AND MANUFACTURING METHOD THEREOF, AND DISPLAY PANEL

(71) Applicants: Hefei Xinsheng Optoelectronics Technology Co., Ltd., Anhui (CN); BOE Technology Group Co., Ltd., Beijing (CN)

(72) Inventors: Wei Li, Beijing (CN); Jingjing Xia, Beijing (CN); Bin Zhou, Beijing (CN); Jun Liu, Beijing (CN); Tongshang Su, Beijing (CN); Yang Zhang, Beijing (CN); Liangchen Yan, Beijing (CN)

(73) Assignees: Hefei Xinsheng Optoelectronics Technology Co., Ltd., Hefei (CN); BOE Technology Group Co., Ltd., Beijing (CN)

(*) Notice: Subject to any disclaimer, the term of this patent is extended or adjusted under 35 U.S.C. 154(b) by 782 days.

(21) Appl. No.: 16/458,341

(22) Filed: Jul. 1, 2019

(65) Prior Publication Data
US 2020/0064734 A1  Feb. 27, 2020

(30) Foreign Application Priority Data

Aug. 23, 2018  (CN) .................. 201810967527.X

(51) Int. Cl.
*G03F 7/038*  (2006.01)
*C08K 5/08*  (2006.01)
(Continued)

(52) U.S. Cl.
CPC ............... *G03F 7/038* (2013.01); *C08K 5/08* (2013.01); *C08K 5/13* (2013.01); *C08L 33/16* (2013.01);
(Continued)

(58) Field of Classification Search
CPC ................... G03F 7/027; G03F 7/028
See application file for complete search history.

(56) References Cited

U.S. PATENT DOCUMENTS 8,530,359 B2 * 9/2013 Mayer ............... H01L 21/32134
 438/692
2012/0141738 A1  6/2012 Miyake et al.
(Continued)

FOREIGN PATENT DOCUMENTS

CN  101984756 A  3/2011
CN  103189797 A  7/2013
(Continued)

OTHER PUBLICATIONS

Machine translation of JP-2017107020-A (no date).*
(Continued)

*Primary Examiner* — Amanda C. Walke
(74) *Attorney, Agent, or Firm* — ArentFox Schiff LLP; Michael Fainberg

(57) ABSTRACT

Disclosed are a photoresist composition, a pixel definition structure and a manufacturing method thereof, and a display panel. The photoresist composition includes an organic film-forming resin, a superhydrophobic polymerizable monomer, a polyfunctional crosslinkable polymerizable monomer, a photoinitiator, an additive and a solvent.

9 Claims, 4 Drawing Sheets

(51) Int. Cl.
*C08K 5/13* (2006.01)
*C08L 33/16* (2006.01)
*C08L 71/02* (2006.01)
*C08L 83/04* (2006.01)
*G03F 7/38* (2006.01)
*G03F 7/40* (2006.01)

(52) U.S. Cl.
CPC .............. *C08L 71/02* (2013.01); *C08L 83/04* (2013.01); *G03F 7/38* (2013.01); *G03F 7/40* (2013.01); *C08L 2203/20* (2013.01)

(56) References Cited

U.S. PATENT DOCUMENTS

2012/0231234 A1* 9/2012 Kodama .................... C08J 3/28
522/108
2014/0162178 A1 6/2014 Na
2018/0113383 A1* 4/2018 Matsumoto ............... C09B 5/62

FOREIGN PATENT DOCUMENTS

| | | | | |
|---|---|---|---|---|
| CN | 103869622 A | | 6/2014 | |
| JP | 2008105414 A | * | 5/2008 | .............. C08F 16/32 |
| JP | 2017107020 A | * | 6/2017 | ............ G03F 7/0048 |
| KR | 2017061062 A | * | 6/2017 | ........ C08F 222/1006 |
| WO | WO-2017090879 A1 | * | 6/2017 | ........ C08F 222/1006 |
| WO | WO-2018008697 A1 | * | 1/2018 | .............. G03F 7/004 |

OTHER PUBLICATIONS

Machine translation of WO 2018-008697 (no date).*
Machine translation of JP 2008-105414 (no date).*
Office Action for corresponding Chinese Application 201810967527.X dated Feb. 24, 2021.

* cited by examiner

PHOTORESIST COMPOSITION, PIXEL DEFINITION STRUCTURE AND MANUFACTURING METHOD THEREOF, AND DISPLAY PANEL

CROSS-REFERENCE TO RELATED APPLICATION

This application claims priority of Chinese Patent Application No. 201810967527.X, filed on Aug. 23, 2018, which is hereby incorporated by reference in its entirety.

TECHNICAL FIELD

The present disclosure relates to the technical field of display, and in particular, to a photoresist composition, a pixel definition structure and a manufacturing method thereof, and a display panel.

BACKGROUND

With the popularity of the Internet and the continuous development of display technology, high-quality display panels have become an important feature of many electronic consumer products. Compared with liquid crystal display panels, organic electroluminescent display panels have the advantages of self-illumination, low energy consumption, low production cost, wide viewing angle, high contrast, fast response, more vivid color display, and easier realization of thinness and flexibility. At present, in the display fields of mobile phones, digital cameras, computers, personal digital assistants, etc., organic electroluminescent (OLED) display panels have begun to replace the traditional liquid crystal display panels, and are expected to become the mainstream choice for the next generation of display panels.

In an OLED display panel, a pixel definition layer includes an aperture area (i.e., a pixel area) and a pixel definition structure (i.e., a Bank area) for defining the aperture area. Specifically, the pixel definition structure is an organic barrier in the aperture area, generally exhibiting a regular trapezoidal structure with a narrow top and a wide bottom to limit inkjet printing ink from escaping to the periphery. The manufacturing process generally includes a process of coating, exposing, developing, curing, etc. of the photoresist material, and removing the photoresist material in the aperture area to form an aperture area and a pixel definition structure. On the one hand, in order to prevent the inkjet solution from spreading on the top of the pixel definition structure to contaminate adjacent pixels, causing cross-coloring, the upper half area of the pixel definition structure needs to exhibit lyophobic properties with the inkjet solution (i.e., ink); on the other hand, in order to uniformly spread the inkjet solution inside the aperture area, the bottom area of the pixel definition structure needs to exhibit lyophilic properties with the inkjet solution. To achieve the distinction between lyophobic properties and lyophilic properties on the top and bottom of the pixel definition structure, the photoresist material used to form the pixel definition structure is often composed of at least one layer of lyophilic material and at least one layer of lyophobic material.

SUMMARY

Some embodiments of the present disclosure provide a photoresist composition, including: an organic film-forming resin, a superhydrophobic polymerizable monomer, a polyfunctional crosslinkable polymerizable monomer, a photoinitiator, an additive and a solvent;

wherein a boiling point of the superhydrophobic polymerizable monomer is higher than a boiling point of the solvent, and lower than a boiling point of the polyfunctional crosslinkable polymerizable monomer, the photoinitiator and the additive;

the additive is configured to prevent polymerization between components in the photoresist composition, providing the photoresist composition with fluidity, and eliminating bubbles in the photoresist composition; and the solvent is configured to disperse the superhydrophobic polymerizable monomer, the polyfunctional crosslinkable polymerizable monomer, the photoinitiator and the additive.

In a possible implementation manner, in the above photoresist composition provided by embodiments of the present disclosure, a mass percentage of the organic film-forming resin is 5%-25%, a mass percentage of the superhydrophobic polymerizable monomer is 0.5%-2%, a mass percentage of the polyfunctional crosslinkable polymerizable monomer is 0.1%-1%, a mass percentage of the photoinitiator is 0.5%-2%, a mass percentage of the additive is 0.1%-1%, and a mass percentage of the solvent is 69%-93.8%.

In a possible implementation manner, in the above photoresist composition provided by embodiments of the present disclosure, the superhydrophobic polymerizable monomer is selected from one or any combination of following compounds:

2,2,2-trifluoroethyl methacrylate, 2,2,3,4,4,4-hexafluorobutyl methacrylate, 2,2,3,3-tetrafluoropropyl methacrylate and perfluorocyclohexyl methacrylate.

In a possible implementation manner, in the above photoresist composition provided by embodiments of the present disclosure, the polyfunctional crosslinkable polymerizable monomer is selected from one or any combination of following compounds:

polydipentaerythritol pentaacrylate, polydipentaerythritol hexaacrylate, polyurethane acrylate and ethoxylated pentaerythritol tetraacrylate.

In a possible implementation manner, in the above photoresist composition provided by embodiments of the present disclosure, the photoinitiator is selected from one or any combination of following compounds:

nitroaniline, anthraquinone, benzophenone and N-acetyl-4-nitronaphthylamine.

In a possible implementation manner, in the above photoresist composition provided by embodiments of the present disclosure, the additive includes a polymerization inhibitor, a leveling agent and an antifoaming agent;

wherein the polymerization inhibitor is configured to prevent polymerization between components in the photoresist composition, and the polymerization inhibitor is selected from one or any combination of following compounds:

hydroquinone, 2-sec-butyl-4,6-dinitrophenol, p-tert-butylcatechol, 2,5-di-tert-butylhydroquinone, isoamyl alcohol, n-hexanol, glycerol and n-hexane;

the leveling agent is configured to provide the photoresist composition with fluidity, and the leveling agent is selected from one or any combination of following compounds:

acrylic compounds, organosilicone compounds and fluorocarbon compounds;

the antifoaming agent is configured to eliminate bubbles in the photoresist composition, and the antifoaming agent is selected from one or any combination of following compounds:

emulsified silicone oil, higher alcohol fatty acid ester complex, polyoxyethylene polyoxypropylene pentaerythritol ether, polyoxyethylene polyoxypropyl ene ether, polyoxypropylene glycerol ether, polyoxypropylene polyoxyethylene glycerol ether and polydimethyl siloxane.

In a possible implementation manner, in the above photoresist composition provided by embodiments of the present disclosure, the solvent is selected from one or any combination of following compounds:

ethyl acetate, tetrahydrofuran, dioxane, trioxane, n-butyl acetate, tert-butyl acetate, ethylene glycol monoacetate, ethylene glycol methyl ether acetate, N-methylpyrrole, propylene glycol, ethylene glycol alkyl ether acetate, propylene glycol monomethyl ether acetate, ethoxyethyl acetate, dimethoxy acetaldehyde, propylene glycol methyl ether acetate, ethyl 3-ethoxypropionate, propylene glycol methyl ether and ethylene glycol ethyl ether acetate.

Based on the same inventive concept, some embodiments of the present disclosure further provide a method for manufacturing a pixel definition structure by using the above photoresist composition, including:

coating a photoresist composition on an array substrate, and vacuuming to remove the solvent to form a matrix of the pixel definition structure;

performing a pre-baking process on the matrix such that a superhydrophobic polymerizable monomer is gradiently distributed in the matrix;

performing an exposure process on the matrix containing the gradiently-distributed superhydrophobic polymerizable monomer such that the superhydrophobic polymerizable monomer in the matrix is combined with crosslinking bridged bonds provided by the polyfunctional crosslinkable polymerizable monomer and a free radical provided by the photoinitiator to cause polymerization; and sequentially performing development and post-baking processes on the matrix after the polymerization to form the pixel definition structure in a fixed shape.

Based on the same inventive concept, some embodiments of the present disclosure further provide a pixel definition structure manufactured by the above method.

Based on the same inventive concept, some embodiments of the present disclosure further provide a display panel, including a pixel definition layer, the pixel definition layer including an aperture and a pixel definition structure for defining an area of the aperture, wherein the pixel definition structure is the above pixel definition structure.

DETAILED DESCRIPTION

Figure 1:
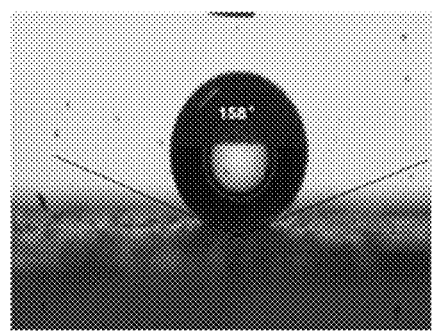
FIG. 1 is a test chart of a water drop contact angle on an upper surface of a film obtained by curing a photoresist composition according to some embodiments of the present disclosure.

The specific implementation manners of the photoresist composition, the pixel definition structure and the manufacturing method thereof, and the display panel provided by the embodiments of the present disclosure are described in detail below with reference to the accompanying drawings. It should be noted that the embodiments described in this specification are only a part of the embodiments, but not all of the embodiments of the present disclosure. In the case of no conflict, the embodiments in the present application and the features in the embodiments may be combined with each other. In addition, all other embodiments obtained by those of ordinary skill in the art based on the embodiments of the present disclosure without creative work fall into the protection scope of the present disclosure.

Some embodiments of the present disclosure provides a photoresist composition, including: an organic film-forming resin, a superhydrophobic polymerizable monomer, a polyfunctional crosslinkable polymerizable monomer, a photoinitiator, an additive and a solvent;

wherein the boiling point of the superhydrophobic polymerizable monomer is higher than the boiling point of the solvent, and lower than the boiling point of the polyfunctional crosslinkable polymerizable monomer, the photoinitiator and the additive;

the additive is configured to prevent polymerization between components in the photoresist composition, providing the photoresist composition with fluidity, and eliminating bubbles in the photoresist composition; and the solvent is configured to disperse the superhydrophobic polymerizable monomer, the polyfunctional crosslinkable polymerizable monomer, the photoinitiator and the additive.

In the photoresist composition provided by the embodiments of the present disclosure, since the boiling point of the superhydrophobic polymerizable monomer is higher than the boiling point of the solvent, and lower than the boiling point of the polyfunctional crosslinkable polymerizable monomer, the photoinitiator and the additive, the superhydrophobic polymerizable monomer can be gradiently distributed in the photoresist composition after solvent removal by performing heat treatment on the photoresist composition, resulting in a difference in the hydrophilic and hydrophobic properties of the top and bottom of the photoresist composition after solvent removal. Based on this, when the photoresist composition provided by the present disclosure is used to manufacture a pixel definition structure having different hydrophilic and hydrophobic properties on the top and bottom, it can be formed by one-time patterning process, thereby simplifying the manufacturing process of the pixel definition structure.

It can be understood that in the above photoresist composition provided by the embodiment of the present disclosure, the superhydrophobic polymerizable monomer can be polymerized under the action of ultraviolet light, the polyfunctional crosslinkable polymerizable monomer provides crosslinking bridged bonds for the polymerization of the superhydrophobic polymerizable monomer, and the photoinitiator provides a free radical for the polymerization of the superhydrophobic polymerizable monomer. The polymerization inhibition effect of the additive is weaker than the combining ability of the superhydrophobic polymerizable monomer with the crosslinking bridged bonds provided by the polyfunctional crosslinkable polymerizable monomer and the free radical provided by the photoinitiator, and is negligible in the process of ultraviolet light-induced polymerization. The polymerization inhibition effect of the additive is mainly manifested in the process of storage, transportation, and the like of the photoresist composition.

Optionally, in the above photoresist composition provided by embodiments of the present disclosure, the mass percentage of the organic film-forming resin is 5%-25%, the mass percentage of the superhydrophobic polymerizable monomer is 0.5%-2%, the mass percentage of the polyfunctional crosslinkable polymerizable monomer is 0.1%-1%, the mass percentage of the photoinitiator is 0.5%-2%, the mass percentage of the additive is 0.1%-1%, and the mass percentage of the solvent is 69%-93.8%.

Optionally, in the above photoresist composition provided by embodiments of the present disclosure, the superhydrophobic polymerizable monomer is selected from one or any combination of the following compounds:

2,2,2-trifluoroethyl methacrylate, 2,2,3,4,4,4-hexafluorobutyl methacrylate, 2,2,3,3-tetrafluoropropyl methacrylate and perfluorocyclohexyl methacrylate.

The polyfunctional crosslinkable polymerizable monomer is selected from one or any combination of the following compounds:

polydipentaerythritol pentaacrylate, polydipentaerythritol hexaacrylate, polyurethane acrylate and ethoxylated pentaerythritol tetraacrylate.

The photoinitiator is selected from one or any combination of the following compounds:

nitroaniline, anthraquinone, benzophenone and N-acetyl-4-nitronaphthylamine.

The additive includes a polymerization inhibitor, a leveling agent and an antifoaming agent;

wherein the polymerization inhibitor is configured to prevent polymerization between components in the photoresist composition, and the polymerization inhibitor is selected from one or any combination of the following compounds:

hydroquinone, 2-sec-butyl-4,6-dinitrophenol, p-tert-butylcatechol, 2,5-di-tert-butylhydroquinone, isoamyl alcohol, n-hexanol, glycerol and n-hexane;

the leveling agent is configured to provide the photoresist composition with fluidity, and the leveling agent is selected from one or any combination of the following compounds:

acrylic compounds, organosilicone compounds and fluorocarbon compounds;

the antifoaming agent is configured to eliminate bubbles in the photoresist composition, and the antifoaming agent is selected from one or any combination of the following compounds:

emulsified silicone oil, higher alcohol fatty acid ester complex, polyoxyethylene polyoxypropylene pentaerythritol ether, polyoxyethylene polyoxypropyl ene ether, polyoxypropylene glycerol ether, polyoxypropylene polyoxyethylene glycerol ether and polydimethyl siloxane.

The solvent is selected from one or any combination of the following compounds:

ethyl acetate, tetrahydrofuran, dioxane, trioxane, n-butyl acetate, tert-butyl acetate, ethylene glycol monoacetate, ethylene glycol methyl ether acetate, N-methylpyrrole, propylene glycol, ethylene glycol alkyl ether acetate, propylene glycol monomethyl ether acetate, ethoxyethyl acetate, dimethoxy acetaldehyde, propylene glycol methyl ether acetate, ethyl 3-ethoxypropionate, propylene glycol methyl ether and ethylene glycol ethyl ether acetate.

In order to better understand the technical solution of the present disclosure, in the following embodiments, the above photoresist composition is cured into a film, and the hydrophilic and hydrophobic properties of the film surface are tested.

In the photoresist composition provided by some embodiments of the present disclosure, the mass percentage of the organic film-forming resin is 15%, and the material of the organic film-forming resin is an acrylic-based host material; the mass percentage of the N-acetyl-4-nitronaphthylamine as the photoinitiator is 0.5%; the mass percentage of the 2,2,3,4,4,4-hexafluorobutyl methacrylate as the superhydrophobic polymerizable monomer is 2%; the mass percentage of the polydipentaerythritol hexaacrylate as the polyfunctional crosslinkable polymerizable monomer is 0.5%; the mass percentage of the additive is 0.1%-1%, and optionally, the additive is composed of 2-sec-butyl-4,6-dinitrophenol and polyoxyethylene polyoxypropylene pentaerythritol ether, the mass ratio of 2-sec-butyl-4,6-dinitrophenol to polyoxyethylene polyoxypropylene pentaerythritol ether being 1:4; and the mass percentage of the solvent is 81%-81.9%, and optionally, the solvent is composed of dioxane and tert-butyl acetate, the mass ratio of dioxane to tert-butyl acetate being 2:3.

Further, the above photoresist composition is cured into a film by the steps as follows. First, a layer of the above photoresist composition is coated on a polytetrafluoroethylene substrate by spin coating, then heated by a heating plate at 150° C. for 1 min, and afterwards cured into a film by ultraviolet light of 365 nm at 100 mW/cm$^2$, and finally, the film is peeled off from the polytetrafluoroethylene substrate.

Figure 2:
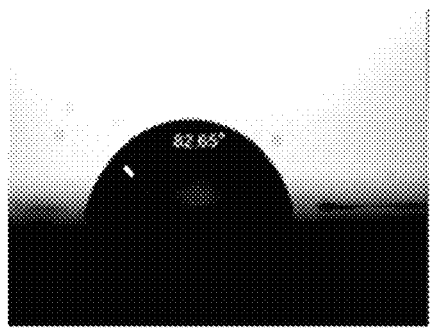
FIG. 2 is a test chart of a water drop contact angle on a lower surface of a film obtained by curing a photoresist composition according to some embodiment of the present disclosure.

Next, the hydrophilic and hydrophobic properties of the upper and lower surfaces of the film are tested. Optionally, the hydrophilic and hydrophobic properties are represented by testing the water drop contact angle of the upper and lower surfaces of the film. The results are shown in FIG. 1 and FIG. 2. FIG. 1 is a test chart of a water drop contact angle on the upper surface of the film. The water drop contact angle is measured to be 158°, that is, the upper surface of the film exhibits superhydrophobic properties. FIG. 2 is a test chart of a water drop contact angle on the lower surface of the film. The water drop contact angle is measured to be 82.65°, that is, the lower surface of the film exhibits hydrophilic properties, and the hydrophilic properties are significantly larger than that of the upper surface. This shows that the film having significantly different hydrophilic and hydrophobic properties on the upper and lower surfaces can be prepared by using the above photoresist composition.

In the photoresist composition provided by another some embodiments of the present disclosure, the mass percentage of the organic film-forming resin is 15%, and the material of the organic film-forming resin is an acrylic-based host material; the mass percentage of the photoinitiator is 0.4%, and optionally, the photoinitiator is composed of nitronaphthylamine and benzophenone, the mass ratio of nitronaphthylamine to benzophenone being 3:1; the mass percentage of the perfluorocyclohexyl methacrylate as the superhydrophobic polymerizable monomer is 2%; the mass percentage of the polydipentaerythritol hexaacrylate as the polyfunctional crosslinkable polymerizable monomer is 0.5%; the mass percentage of the additive is 0.1%-1%, and optionally, the additive is composed of 2-sec-butyl-4,6-dinitrophenol and polyoxyethylene polyoxypropylene pentaerythritol ether, the mass ratio of 2-sec-butyl-4,6-dinitrophenol to polyoxyethylene polyoxypropylene pentaerythritol ether being 1:4; and the mass percentage of the solvent is 81.1%-82%, and optionally, the solvent is composed of tetrahydrofuran and tert-butyl acetate, the mass ratio of tetrahydrofuran to tert-butyl acetate being 2:3.

Further, the above photoresist composition is cured into a film by the steps as follows. First, a layer of the above photoresist composition is coated on a polytetrafluoroethylene substrate by spin coating, then heated by a heating plate at 160° C. for 1 min, and afterwards cured into a film by ultraviolet light of 365 nm at 100 mW/cm$^2$, and finally, the film is peeled off from the polytetrafluoroethylene substrate.

Figure 3:
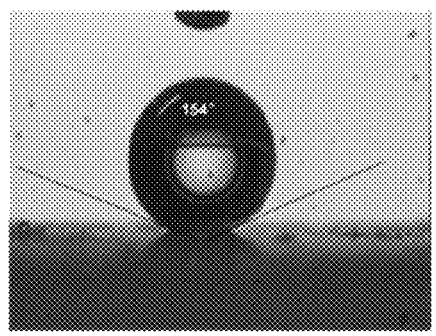
FIG. 3 is a test chart of a water drop contact angle on an upper surface of a film obtained by curing a photoresist composition according to another some embodiments of the present disclosure.
Figure 4:
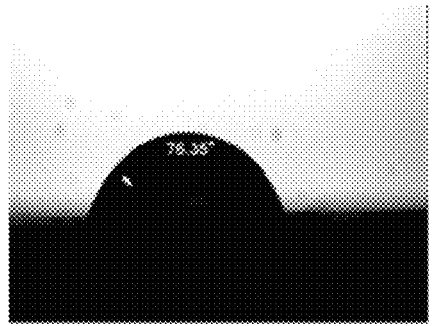
FIG. 4 is a test chart of a water drop contact angle on a lower surface of a film obtained by curing a photoresist composition according to another some embodiments of the present disclosure.

Next, the hydrophilic and hydrophobic properties of the upper and lower surfaces of the film are tested. Optionally, the hydrophilic and hydrophobic properties are represented by testing the water drop contact angle of the upper and lower surfaces of the film. The results are shown in FIG. 3 and FIG. 4. FIG. 3 is a test chart of a water drop contact angle on the upper surface of the film. The water drop contact angle is measured to be 154°, that is, the upper surface of the film exhibits superhydrophobic properties. FIG. 4 is a test chart of a water drop contact angle on the lower surface of the film. The water drop contact angle is measured to be 76.35°, that is, the lower surface of the film exhibits hydrophilic properties, and the hydrophilic properties are significantly larger than that of the upper surface. This shows that the film having significantly different hydrophilic and hydrophobic properties on the upper and lower surfaces can be prepared by using the above photoresist composition.

It can be seen from the above embodiments that the photoresist composition provided by the present disclosure can obtain a film having a large difference in hydrophilic and hydrophobic properties between the upper surface (i.e., top) and the lower surface (i.e., bottom), and therefore, the pixel definition structure having different hydrophilic and hydrophobic properties on the top and bottom can be prepared by using the photoresist composition provided by the present disclosure. A method of manufacturing a pixel definition structure by using the photoresist composition provided by the present disclosure will be described in detail below.

Figure 5:
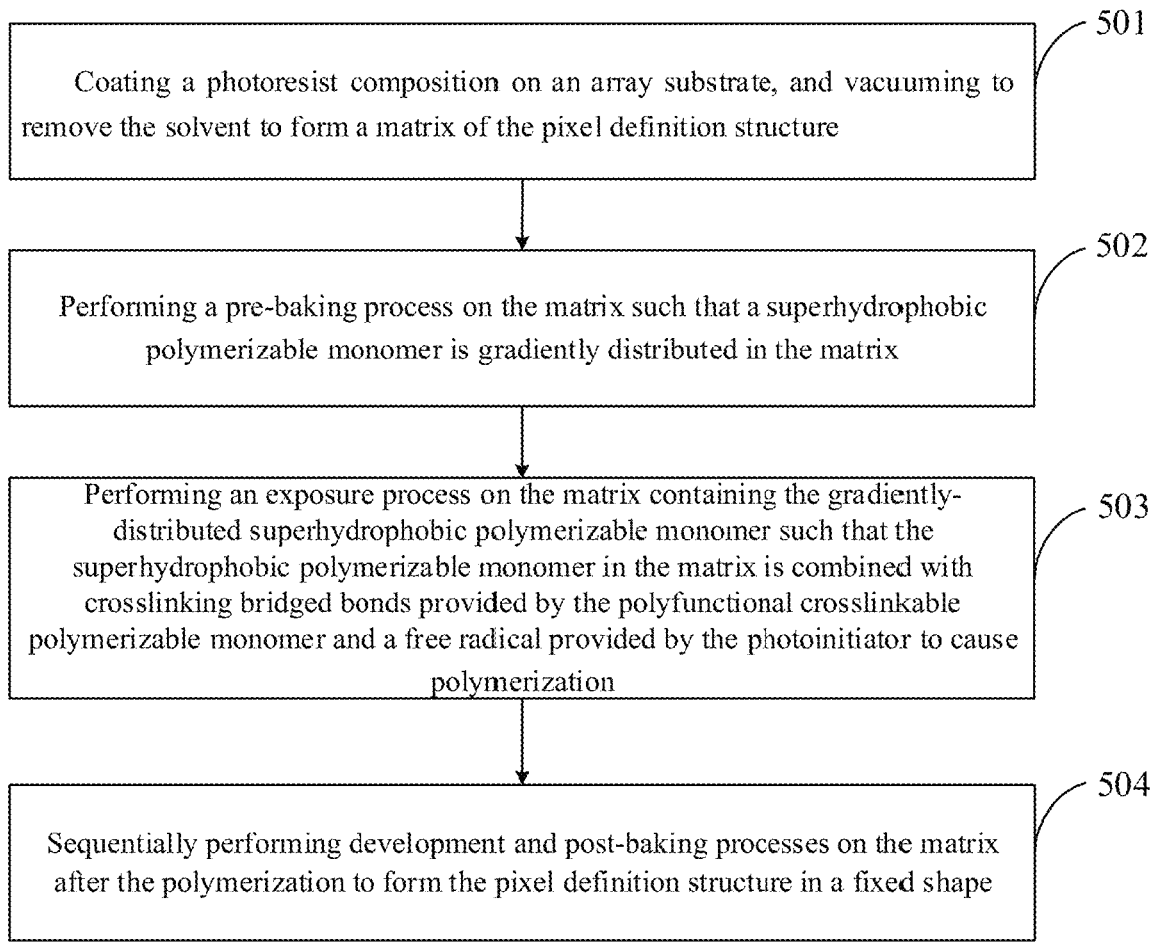
FIG. 5 is a flowchart of a method of manufacturing a pixel definition structure by using a photoresist composition provided by some embodiments of the present disclosure.

Optionally, the method of manufacturing a pixel definition structure by using the photoresist composition provided by the present disclosure, as shown in FIG. 5, includes the following steps.

S501, a photoresist composition is coated on an array substrate, and vacuumed to remove the solvent to form a matrix of the pixel definition structure.

Figure 6:
FIG. 6 is a structure schematic diagram of an array substrate having no pixel definition structure in the related art.
Figure 7:
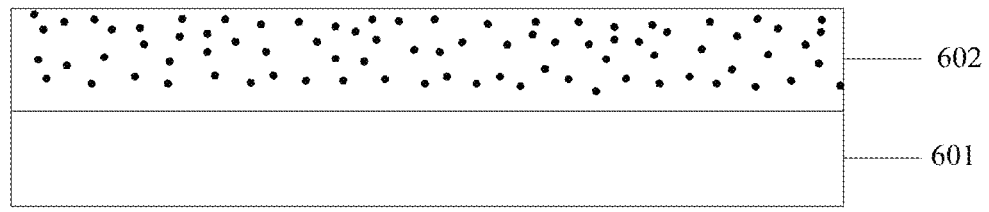
FIG. 7 is a structure schematic diagram of an array substrate coated with a photoresist composition.

Optionally, before coating the photoresist composition on the array substrate, it is also necessary to provide an array substrate 601 having no pixel definition structure, as shown in FIG. 6. Further, a photoresist composition 602 may be coated on the array substrate 601 by spin coating or the like, as shown in FIG. 7. Optionally, the thickness of the layer in which the photoresist composition 602 is located may be 1 μm-3 μm, and the vacuuming pressure for removing the solvent is 30 Pa.

S502, a pre-baking process is performed on the matrix such that a superhydrophobic polymerizable monomer is gradiently distributed in the matrix.

Figure 8:
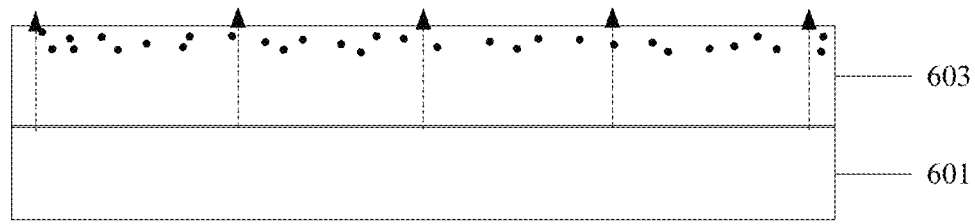
FIG. 8 is a structure schematic diagram of an array substrate in a pre-baking process.

Optionally, when the matrix 603 is subjected to the pre-baking process, a structure schematic diagram of the corresponding array substrate is shown in FIG. 8. In order that the superhydrophobic polymerizable monomer (i.e., the black dots in FIG. 8) can move from bottom to top in the matrix 603 and finally be gradiently distributed in the matrix 603, the temperature required for pre-baking should be higher than the boiling point of the superhydrophobic polymerizable polymer and lower than the boiling point of the polyfunctional crosslinkable polymerizable monomer, the photoinitiator and the additive. It can be understood that the longer the pre-baking process is, the lower the concentration of the superhydrophobic polymerizable monomer in the matrix 603 is, showing a decreasing tendency from top to bottom. Therefore, the gradient distribution of the superhydrophobic polymerizable monomer from top to bottom in the matrix 603 can be achieved by controlling the pre-baking temperature and time. For example, when the superhydrophobic polymerizable monomer is 2,2,3,4,4,4-hexafluorobutyl methacrylate, the temperature of the prebaking process may be 150° C.-160° C., and the time may be 1-2 min.

S503, an exposure process is performed on the matrix containing the gradiently-distributed superhydrophobic polymerizable monomer such that the superhydrophobic polymerizable monomer in the matrix can be combined with crosslinking bridged bonds provided by the polyfunctional crosslinkable polymerizable monomer and a free radical provided by the photoinitiator to cause polymerization.

Figure 9:
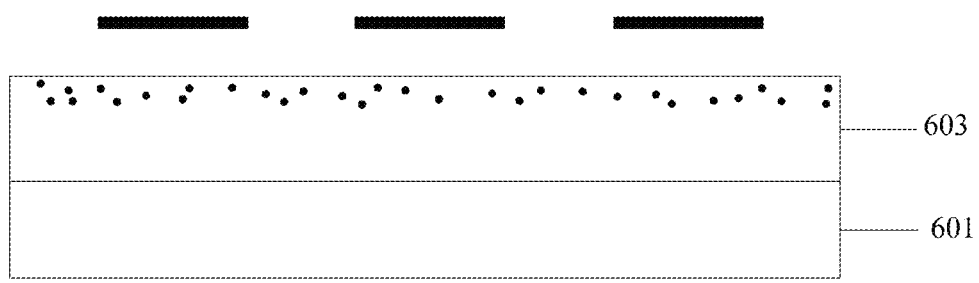
FIG. 9 is a structure schematic diagram of an array substrate in an exposure process.

Optionally, the energy density of the ultraviolet light required by the exposure process is 30 mJ/cm$^2$ to 100 mJ/cm$^2$, so that the superhydrophobic polymerizable monomer is bonded to the matrix 603 after being combined with the crosslinking bridged bonds provided by the polyfunctional crosslinkable polymerizable monomer and the free radical provided by the photoinitiator, and thus, the hydrophilic and hydrophobic properties of the top and bottom of the matrix 603 are different, as shown in FIG. 9.

S504, development and post-baking processes are sequentially performed on the matrix after the polymerization to form the pixel definition structure in a fixed shape.

Figure 10:
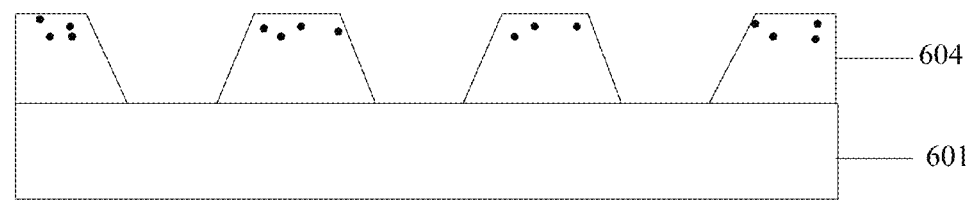
FIG. 10 is a structure schematic diagram of an array substrate in a post-baking process.

Optionally, the post-baking process is performed at a temperature of 230° C. for 30 min to finally obtain a regular trapezoidal pixel definition structure 604 having a narrow top and a wide bottom, as shown in FIG. 10.

It can be seen from the above description that by using the photoresist composition provided by the present disclosure, a pixel definition structure having a gradient change from hydrophobic properties to hydrophilic properties from top to bottom is formed by a one-time patterning process of pre-baking, exposure, development and post-baking. On the basis of simplifying the manufacturing process of the pixel definition structure, it is ensured that the ink is no longer spread on the top to contaminate the adjacent pixels, and the ink can be uniformly spread inside the pixel aperture, thereby improving the uniformity of the film formation of the luminescent material and improving the display effect and product quality of the display panel.

Based on the same inventive concept, some embodiments of the present disclosure provide a pixel definition structure manufactured by the above method. The principle of solving the problem by the pixel definition structure is similar to the principle of solving the problem by the foregoing method. Therefore, the implementation of the pixel definition structure provided by the embodiment of the present disclosure can be implemented by referring to the implementation of the foregoing method provided by the embodiment of the present disclosure, and the repetitions will not be described herein again.

Based on the same inventive concept, some embodiments of the present disclosure further provide a display panel, including a pixel definition layer, the pixel definition layer including an aperture and a pixel definition structure for defining an area in which the aperture is located. The display panel is an OLED display panel, and can be optionally applied to: a mobile phone, a tablet computer, a television, a display, a notebook computer, a digital camera, a navigator, a smart watch, a fitness wristband, a personal digital assistant, an automatic teller machine, or any product or component with a display function. Other indispensable components of the display panel are understood by those skilled in the art, and are not described herein again, nor should they be construed as a limitation to the present disclosure. For the implementation of the display panel, reference may be made to the embodiment of the foregoing pixel definition structure, and the repetitions will not be described herein again.

It will be apparent that those skilled in the art can make various modifications and variations to the present disclosure without departing from the spirit and scope of the present disclosure. Thus, if such modifications and variations of the present disclosure fall within the scope of the claims of the present disclosure and the equivalents thereof, the present disclosure is also intended to cover such modifications and variations.

The invention claimed is:

1. A photoresist composition, comprising: an organic film-forming resin, a superhydrophobic polymerizable monomer, a polyfunctional crosslinkable polymerizable monomer, a photoinitiator, an additive and a solvent;
    wherein a boiling point of the superhydrophobic polymerizable monomer is higher than a boiling point of the solvent, and lower than a boiling point of the polyfunctional crosslinkable polymerizable monomer, the photoinitiator and the additive;
    the additive is configured to prevent polymerization between components in the photoresist composition, providing the photoresist composition with fluidity, and eliminating bubbles in the photoresist composition; and
    the solvent is configured to disperse the superhydrophobic polymerizable monomer, the polyfunctional crosslinkable polymerizable monomer, the photoinitiator and the additives
    wherein a mass percentage of the organic film-forming resin is 5%-25%, a mass percentage of the superhydrophobic polymerizable monomer is 0.5%-2%, a mass percentage of the polyfunctional crosslinkable polymerizable monomer is 0.1%-1%, a mass percentage of the photoinitiator is 0.5%-2%, a mass percentage of the additive is 0.1%-1%, and a mass percentage of the solvent is 69%-93.8%.

2. The photoresist composition according to claim 1, wherein the superhydrophobic polymerizable monomer is selected from one or any combination of following compounds:
    2,2,2-trifluoroethyl methacrylate, 2,2,3,4,4,4-hexafluorobutyl methacrylate, 2,2,3,3-tetrafluoropropyl methacrylate and perfluorocyclohexyl methacrylate.

3. The photoresist composition according to claim 1, wherein the polyfunctional crosslinkable polymerizable monomer is selected from one or any combination of following compounds:
    polydipentaerythritol pentaacrylate, polydipentaerythritol hexaacrylate, polyurethane acrylate and ethoxylated pentaerythritol tetraacrylate.

4. The photoresist composition according to claim 1, wherein the photoinitiator is selected from one or any combination of following compounds:
    nitroaniline, anthraquinone, benzophenone and N-acetyl-4-nitronaphthylamine.

5. The photoresist composition according to claim 1, wherein the additive comprises a polymerization inhibitor, a leveling agent, and an antifoaming agent;
    wherein the polymerization inhibitor is configured to prevent polymerization between components in the photoresist composition, and the polymerization inhibitor is selected from one or any combination of following compounds:
    hydroquinone, 2-sec-butyl-4,6-dinitrophenol, p-tert-butylcatechol, 2,5-di-tert-butylhydroquinone, isoamyl alcohol, n-hexanol, glycerol and n-hexane;
    the leveling agent is configured to provide the photoresist composition with fluidity, and the leveling agent is selected from one or any combination of following compounds:
    acrylic compounds, organosilicone compounds and fluorocarbon compounds;
    the antifoaming agent is configured to eliminate bubbles in the photoresist composition, and the antifoaming agent is selected from one or any combination of the following compounds:
    emulsified silicone oil, higher alcohol fatty acid ester complex, polyoxyethylene polyoxypropylene pentaerythritol ether, polyoxyethylene polyoxypropylene ether, polyoxypropylene glycerol ether, polyoxypropylene polyoxyethylene glycerol ether and poly dimethylsiloxane.

6. The photoresist composition according to claim 1, wherein the solvent is selected from one or any combination of following compounds:
    ethyl acetate, tetrahydrofuran, dioxane, trioxane, n-butyl acetate, tert-butyl acetate, ethylene glycol monoacetate, ethylene glycol methyl ether acetate, N-methylpyrrole, propylene glycol, ethylene glycol alkyl ether acetate, propylene glycol monomethyl ether acetate, ethoxyethyl acetate, dimethoxy acetaldehyde, propylene glycol methyl ether acetate, ethyl 3-ethoxypropionate, propylene glycol methyl ether and ethylene glycol ethyl ether acetate.

7. A method of manufacturing a pixel definition structure by using the photoresist composition according to claim 1, comprising:
    coating a photoresist composition on an array substrate, and vacuuming to remove the solvent to form a matrix of the pixel definition structure;
    performing a pre-baking process on the matrix such that a superhydrophobic polymerizable monomer is gradiently distributed in the matrix;
    performing an exposure process on the matrix containing the gradiently-distributed superhydrophobic polymerizable monomer such that the superhydrophobic polymerizable monomer in the matrix is combined with crosslinking bridged bonds provided by the polyfunctional crosslinkable polymerizable monomer and a free radical provided by the photoinitiator to cause polymerization; and sequentially performing development and post-baking processes on the matrix after the polymerization to form the pixel definition structure in a fixed shape.

8. A pixel definition structure, wherein the pixel definition structure is manufactured by the method according to claim 7.

9. A display panel, comprising a pixel definition layer, the pixel definition layer comprising an aperture and a pixel definition structure for defining an area of the aperture, wherein the pixel definition structure is the pixel definition structure according to claim 8.

* * * * *